(12) United States Patent
Gregory et al.

(10) Patent No.: US 12,336,143 B2
(45) Date of Patent: Jun. 17, 2025

(54) SYSTEMS AND METHODS FOR THREE-DIMENSIONAL VAPOR CHAMBERS IN IMMERSION-COOLED DATACENTERS

(71) Applicant: Microsoft Technology Licensing, LLC, Redmond, WA (US)

(72) Inventors: Luke Thomas Gregory, Mercer Island, WA (US); Brandon Earl Gary, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 387 days.

(21) Appl. No.: 17/535,287

(22) Filed: Nov. 24, 2021

(65) Prior Publication Data
US 2023/0164953 A1    May 25, 2023

(51) Int. Cl.
*H05K 7/20*     (2006.01)
*F28F 13/18*    (2006.01)

(52) U.S. Cl.
CPC ........... *H05K 7/203* (2013.01); *F28F 13/187* (2013.01); *H05K 7/20827* (2013.01)

(58) Field of Classification Search
CPC ...... F28F 13/187; F28F 3/12; H05K 7/20827; H05K 7/20309; H05K 7/20809; H05K 7/20818; F28D 2021/0029; H01L 23/427
See application file for complete search history.

(56) References Cited

U.S. PATENT DOCUMENTS

| | | | |
|---|---|---|---|
| 5,814,392 A | 9/1998 | You et al. | |
| 6,490,160 B2* | 12/2002 | Dibene, II | H05K 1/141 174/15.2 |
| 7,369,410 B2 | 5/2008 | Chen et al. | |
| 9,436,235 B2* | 9/2016 | Damaraju | H01L 23/427 |
| 10,945,352 B2 | 3/2021 | Shen et al. | |
| 2002/0142165 A1 | 10/2002 | Norley et al. | |
| 2005/0173098 A1* | 8/2005 | Connors | F28D 15/0233 165/104.21 |
| 2007/0258213 A1* | 11/2007 | Chen | H01L 23/427 257/E23.088 |
| 2008/0093058 A1 | 4/2008 | Kim | |

(Continued)

FOREIGN PATENT DOCUMENTS

CN    205755233 U    11/2016
WO    0211506 A2    2/2002

(Continued)

OTHER PUBLICATIONS

Soule, Christopher A., "Future Trends in Heat Sink Design", Retrieved from: https://www.electronics-cooling.com/2001/02/future-trends-in-heat-sink-design/, Feb. 1, 2001, 17 Pages.

(Continued)

*Primary Examiner* — Lionel Nouketcha
(74) *Attorney, Agent, or Firm* — RAY QUINNEY & NEBEKER P.C.; Paul N. Taylor

(57) ABSTRACT

A vapor chamber includes a main body, a first vertical structure, and an enhanced boiling surface. The main body has a first surface and defines a first portion of an interior volume. The first vertical structure protrudes transverse to the main body and defines a second portion of the interior volume. The enhanced boiling surface is on at least a portion of the first vertical structure.

20 Claims, 5 Drawing Sheets

(56) References Cited

U.S. PATENT DOCUMENTS

| | | | |
|---|---|---|---|
| 2010/0018678 A1* | 1/2010 | Siu | F28D 15/0233 |
| | | | 165/104.33 |
| 2014/0224466 A1 | 8/2014 | Lin et al. | |
| 2014/0352928 A1 | 12/2014 | Huang et al. | |
| 2016/0324031 A1 | 11/2016 | Fujiwara | |
| 2017/0117451 A1 | 4/2017 | Matsumoto | |
| 2017/0176114 A1* | 6/2017 | Kandlikar | F28F 13/187 |
| 2018/0031330 A1* | 2/2018 | Roberts | F28D 15/046 |
| 2019/0032909 A1 | 1/2019 | Koga et al. | |

FOREIGN PATENT DOCUMENTS

| | | |
|---|---|---|
| WO | 2013117213 A1 | 8/2013 |
| WO | 2021110052 A1 | 6/2021 |

OTHER PUBLICATIONS

"International Search Report and Written Opinion Issued in PCT Application No. PCT/US22/042417", Mailed Date: Jan. 3, 2023, 13 Pages.

* cited by examiner

SYSTEMS AND METHODS FOR THREE-DIMENSIONAL VAPOR CHAMBERS IN IMMERSION-COOLED DATACENTERS

BACKGROUND

Background and Relevant Art

Computing devices can generate a large amount of heat during use. The computing components can be susceptible to damage from the heat and commonly require cooling systems to maintain the component temperatures in a safe range during heavy processing or usage loads. Different computing components produce different amounts of thermal energy and require different amounts of thermal management. Conventional thermal management systems cool the entire device uniformly, which may insufficiently cool the high-capacity components and/or waste energy cooling components that may not need the thermal management.

BRIEF SUMMARY

In some embodiments, a vapor chamber includes a main body, a first vertical structure, and an enhanced boiling surface. The main body has a first surface and defines a first portion of an interior volume. The first vertical structure protrudes transverse to the main body and defines a second portion of the interior volume. The enhanced boiling surface is on at least a portion of the first vertical structure.

In some embodiments, a vapor chamber includes a main body and a first vertical structure. The main body has a first surface and defining a first portion of an interior volume. The first vertical structure protrudes transverse to the main body and defines a second portion of the interior volume. The first vertical structure has a first end having first width and a second end having a second width that is less than the first width.

In some embodiments, a vapor chamber includes a main body, a first vertical structure, and a wicking structure. The main body has a first surface and defining a first portion of an interior volume. The first vertical structure protrudes transverse to the main body and defines a second portion of the interior volume. The wicking structure is in the interior volume.

In some embodiments, a thermal management system includes a heat-generating component, a vapor chamber, and an immersion working fluid. The vapor chamber is thermally connected to the heat-generating component to conduct thermal energy from the heat-generating component. The vapor chamber includes a main body, at least one vertical structure, and an enhanced boiling surface. The main body is substantially parallel to the heat-generating component, and the vapor chamber defines an interior volume containing a vapor chamber working fluid. The at least one vertical structure of the vapor chamber containing at least a portion of the interior volume and vapor chamber working fluid, and the vertical structure protruding transverse to the main body. The enhanced boiling surface located on at least a portion of the vertical structure. The immersion working fluid contacts at least a portion of the vapor chamber.

In some embodiments, a thermal management system includes a heat-generating component, a vapor chamber, and an immersion working fluid. The vapor chamber is thermally connected to the heat-generating component to conduct thermal energy from the heat-generating component. The vapor chamber includes an interior volume, a main body, a plurality of vertical structures, and an enhanced boiling surface. The interior volume contains a vapor chamber working fluid. The main body contains at least a portion of the interior volume and vapor chamber working fluid, and a plane of the main body is oriented in a direction of gravity and substantially parallel to the heat-generating component. The plurality of vertical structures contains at least a portion of the interior volume and vapor chamber working fluid, and the vertical structures protrude transverse to the main body and define at least one channel. The enhanced boiling surface located on at least a portion of the vertical structures and main body in the channel. The immersion working fluid contacts at least a portion of the vapor chamber.

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a perspective view of a vapor chamber, according to at least one embodiment of the present disclosure;

FIG. 3-2 is a perspective view of another vapor chamber, according to at least one embodiment of the present disclosure;

DETAILED DESCRIPTION

The present disclosure relates generally to systems and methods for thermal management of electronic devices or other heat-generating components Immersion chambers surround the heat-generating components in a liquid working fluid, which conducts heat from the heat-generating components to cool the heat-generating components. As the working fluid absorbs heat from the heat-generating components, the temperature of the working fluid increases. In some embodiments, the hot working fluid is circulated through the thermal management system to cool the working fluid and/or replace the working fluid with cool working fluid. In some embodiments, the working fluid vaporizes, introducing vapor into the liquid of the working fluid which rises out of the liquid phase, carrying thermal energy away from the heat-generating components in the gas phase via the latent heat of boiling.

In large-scale computing centers, such as cloud-computing centers, data processing centers, data storage centers, or other computing facilities, immersion cooling systems provide an efficient method of thermal management for many computing components under a variety of operating loads. In some embodiments, an immersion cooling system includes a working fluid in an immersion chamber and a heat exchanger to cool the liquid phase and/or a condenser to extract heat from the vapor phase of the working fluid. The heat exchanger may include a condenser that condenses the vapor phase of the working fluid into a liquid phase and returns the liquid working fluid to the immersion chamber. In some embodiments, the liquid working fluid absorbs heat from the heat-generating components, and one or more fluid conduits direct the hot liquid working fluid outside of the immersion chamber to a radiator, heat exchanger, or region of lower temperature to cool the liquid working fluid.

In some embodiments, a high-capacity component of the computing devices or systems in the immersion cooling system requires a large amount of thermal management. The heat generated by the high-capacity component may be transferred to the immersion working fluid by a heat spreader. In some embodiments, the heat spreader includes a vapor chamber including three-dimensional surface features and/or surface treatments to increase heat transfer and/or boiling of the immersion working fluid on a surface of the vapor chamber.

Whether the immersion cooling system is a two-phase cooling system (wherein the working fluid vaporizes and condenses in a cycle) or a one-phase cooling system (wherein the working fluid remains in a single phase in a cycle), the heat transported from the heat-generating components outside of the immersion chamber is further exchanged with an ambient fluid to exhaust the heat from the system.

Figure 1:
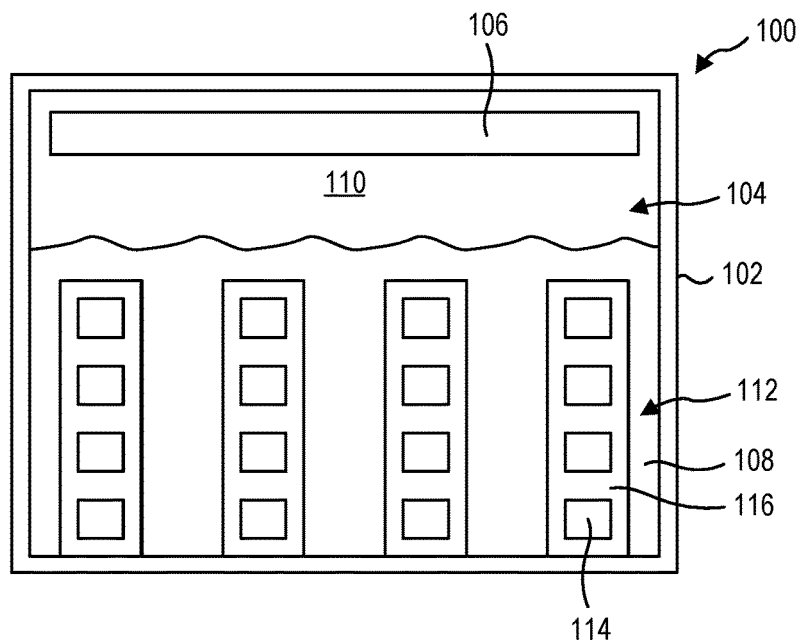
FIG. 1 is a side schematic representation of an immersion cooling system, according to at least one embodiment of the present disclosure.

An illustrative immersion cooling system 100, shown in FIG. 1, includes an immersion tank 102 containing an immersion chamber 104 and a condenser 106 in the immersion chamber 104. The immersion chamber 104 contains an immersion working fluid that has a liquid working fluid 108 and a vapor working fluid 110 portion. The liquid working fluid 108 creates an immersion bath 112 in which a plurality of heat-generating components 114 are positioned to heat the liquid working fluid 108 on supports 116.

Figure 2:
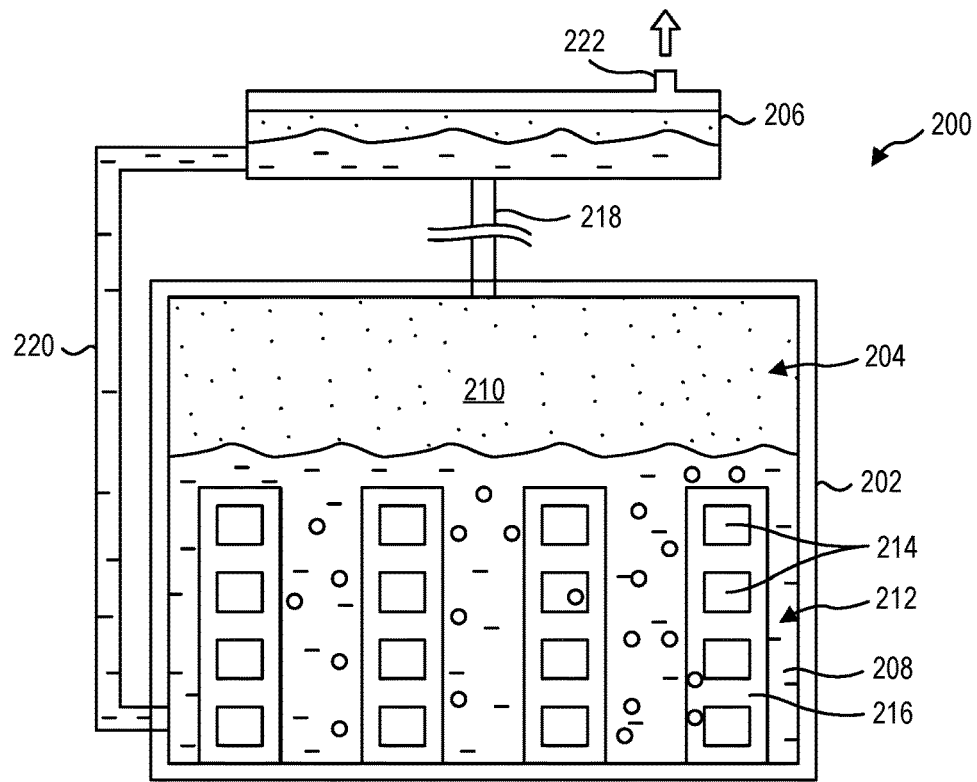
FIG. 2 is a side schematic representation of an immersion cooling system with an external condenser, according to at least one embodiment of the present disclosure.

Referring now to FIG. 2, an immersion cooling system 200 according to the present disclosure includes an immersion tank 202 defining an immersion chamber 204 with an immersion working fluid positioned therein. In some embodiments, the immersion working fluid transitions between a liquid phase 208 of the immersion working fluid and a vapor phase 210 of the immersion working fluid to remove heat from hot or heat-generating components 214 in the immersion chamber 204. The liquid phase 208 of the immersion working fluid more efficiency receives heat from the heat-generating components 214 and, upon transition to the vapor phase 210 of the immersion working fluid, the vapor phase 210 of the immersion working fluid is optionally removed from the immersion tank 202, cooled and condensed by the condenser 206 (or other heat exchanger) to extract the heat from the immersion working fluid, and the liquid phase 208 of the immersion working fluid is optionally returned to the liquid immersion bath 212.

In some embodiments, a server computer or other computing device is positioned inside an immersion tank 202 for cooling. The immersion tank 202 houses a liquid phase 208 of the immersion working fluid that cools the server computer by absorbing heat from the components of the server computer. In some embodiments, the immersion bath 212 of the liquid phase 208 of the immersion working fluid has a plurality of heat-generating components 214 positioned in the liquid phase 208 of the immersion working fluid. The liquid phase 208 of the immersion working fluid surrounds at least a portion of the heat-generating components 214 and other objects or parts attached to the heat-generating components 214. In some embodiments, the heat-generating components 214 are positioned in the liquid phase 208 of the immersion working fluid on one or more supports 216. The support 216 supports one or more heat-generating components 214 in the liquid phase 208 of the immersion working fluid and allows the working fluid to move around the heat-generating components 214. In some embodiments, the support 216 is thermally conductive to conduct heat from the heat-generating components 214. The support(s) 216 may increase the effective surface area from which the liquid phase 208 of the immersion working fluid removes heat through convective cooling.

In some embodiments, the heat-generating components 214 include electronic or computing components or power supplies. In some embodiments, the heat-generating components 214 include computer devices, such as an individual personal computer or a server computer (e.g., a server blade computer). In some embodiments, the high-capacity components of the server computer, such as a CPU, GPU, or other components generate large amounts of heat. In some embodiments, one or more of the heat-generating components 214 includes a heat sink or other device attached to the heat-generating component 214 to conduct away thermal energy and effectively increase the surface area of the heat-generating component 214. In some embodiments, the heat sink of the heat-generating component 214 is a vapor chamber with one or more three-dimensional structures to increase surface area.

As described, conversion of the liquid phase 208 of the immersion working fluid to a vapor phase requires the input of thermal energy to overcome the latent heat of vaporization and may be an effective mechanism to increase the thermal capacity of the working fluid and remove heat from the heat-generating components. In use, the liquid phase 208 of the immersion working fluid is vaporized into a vapor phase 210 of the immersion working fluid which rises in the tank toward a condenser 206. Because the vapor phase 210 of the immersion working fluid rises in the liquid phase 208 of the immersion working fluid, the vapor phase 210 of the immersion working fluid is extracted from the immersion chamber 204 in an upper vapor region of the chamber, in some embodiments. A condenser 206 cools part of the vapor phase 210 of the immersion working fluid back into a liquid phase 208 of the immersion working fluid, removing thermal energy from the system and reintroducing the working fluid into the immersion bath 212 of the liquid phase 208 of the immersion working fluid. The condenser 206 radiates or otherwise dumps the thermal energy from the working fluid into the ambient environment or into a conduit to carry the thermal energy away from the cooling system.

In some examples, an immersion cooling system 200 includes an air-cooled condenser 206. An air-cooled condenser 206 may include fans or pumps to force ambient air over one or more heat pipes or fins to conduct heat from the condenser to the air.

In some embodiments of immersion cooling systems, a liquid-cooled condenser is integrated into the immersion tank and/or the chamber to efficiency remove the thermal energy from the working fluid. In some embodiments, an immersion cooling system 200 for thermal management of computing devices allows at least one immersion tank 202 and/or chamber 204 to be connected to and in fluid communication with an external condenser 206. In some embodiments, an immersion cooling system 200 includes a vapor return line 218 that connects the immersion tank 202 to the condenser 206 and allows vapor phase 210 of the immersion working fluid to enter the condenser 206 from the immersion tank 202 and/or chamber 204 and a liquid return line 220 that connects the immersion tank 202 to the condenser 206 and allows liquid phase 208 of the immersion working fluid to return to the immersion tank 202 and/or chamber 204.

The vapor return line 218 may be colder than the boiling temperature of the working fluid. In some embodiments, a portion of the vapor phase 210 of the immersion working fluid condenses in the vapor return line 218. The vapor return line 218 can, in some embodiments, be oriented at an angle such that the vapor return line 218 is non-perpendicular to the direction of gravity. The condensed working fluid then drains either back to the immersion tank 202 or forward to the condenser 206 depending on the direction of the vapor return line 218 slope. In some embodiments, the vapor return line 218 includes a liquid collection line or valve, such as a bleeder valve, that allows the collection and/or return of the condensed working fluid to the immersion tank 202 or condenser 206.

In some embodiments, the circulation of immersion working fluid through the immersion cooling system 200 causes liquid phase 208 of the immersion working fluid to flow past one or more heat-generating components 214. In embodiments where a heat-generating component 214 has a vapor chamber heat sink, the dynamics of liquid phase 208 of the immersion working fluid are used to move vapor chamber working fluid within the vapor chamber and/or the boiling of the immersion working fluid by the vapor chamber drives flow of the immersion working fluid.

In some embodiments, a vapor chamber heat sink transfers heat to the immersion working fluid to boil the liquid phase of the immersion working fluid, and the fluidic drag of the vapor bubbles further induces flow of the immersion working fluid across a surface of the vapor chamber.

In some embodiments, the heat-generating components, supports, or other elements of the immersion cooling system positioned in the working fluid have nucleation sites on a surface thereof that promote the nucleation of vapor bubbles of the working fluid at or below the boiling temperature of the working fluid.

Immersion working fluid is recycled through the immersion cooling system and, in some embodiments, the working fluid is a dielectric fluid or other fluid that is expensive. An immersion cooling system that uses less working fluid and/or uses the working fluid more efficiently allows for cost savings in the working fluid. In some embodiments, a vapor chamber heat sink according to the present disclosure allows for cooling of the high-capacity components in a larger cooling volume of the immersion working fluid, more efficiently utilizing the available immersion working fluid.

In some embodiments, the liquid phase of the immersion working fluid receives heat in a cooling volume of immersion working fluid immediately surrounding the heat-generating components. The cooling volume is the region of the immersion working fluid (including both liquid and vapor phases) that is immediately surrounding the heat-generating components and is responsible for the convective cooling of the heat-generating components. In some embodiments, the cooling volume is the volume of immersion working fluid within 5 millimeters (mm) of the heat-generating components. A larger cooling volume, therefore, can therefore provide a larger thermal mass to conduct heat away from the heat-generating component.

The immersion working fluid has a boiling temperature below a critical temperature at which the heat-generating components experience thermal damage. For example, the heat-generating components may be computing components that experience damage above 100° Celsius (C). In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure.

In some embodiments, the immersion working fluid includes water. In some embodiments, the immersion working fluid includes glycol. In some embodiments, the immersion working fluid includes a combination of water and glycol. In some embodiments, the immersion working fluid is an aqueous solution. In some embodiments, the immersion working fluid is a non-conductive fluid. In some embodiments, the immersion working fluid is an electronic liquid, such as FC-72 available from 3M.

Figures 1, 3:
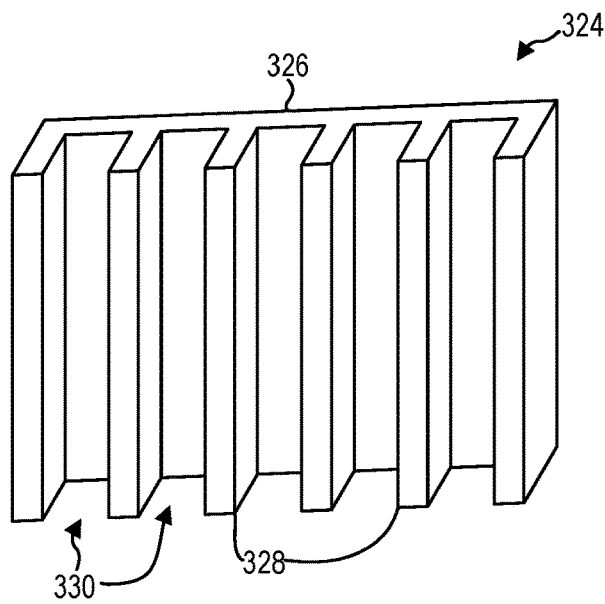
Figures 2, 3:
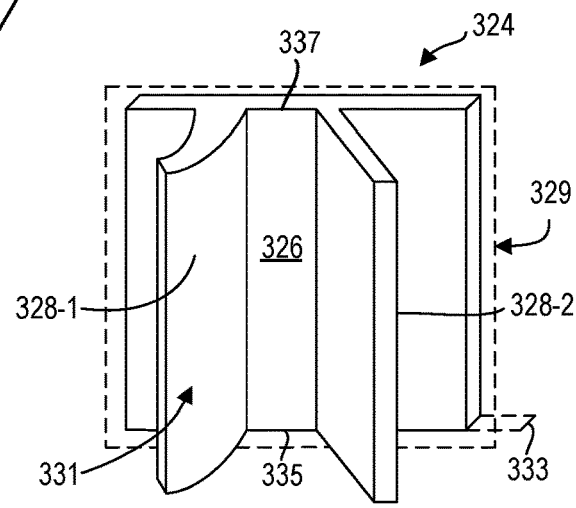

FIG. 3-1 is a perspective view of a vapor chamber 324 according to the present disclosure. In some embodiments, a vapor chamber 324 has a main body 326 with one or more vertical structures 328 protruding from the main body 326 in a direction transverse to the main body 326. In the illustrated embodiment of FIG. 3, the main body has six vertical structures 328 protruding from the main body 326 substantially perpendicular to a plane of the main body 326. In some embodiments, the vertical structures 328 extend at least partially perpendicular to the plane of the main body 326. In other embodiments, at least one of the vertical structures 328 protrudes at a non-perpendicular angle to the main body 326 or have a curved surface or non-planar surface that is non-perpendicular to the main body 326, but the dimensions of vertical structure 328 include a transverse component such that the vertical structure 328 protrudes in a perpendicular direction. In at least one example, the vertical structure 328 protrudes from the main body 326 at approximately a 45° angle, and the vertical structure 328 projects in the direction of the plane of the main body 326 an equal amount to projecting in the perpendicular direction of the plane of the main body 326.

FIG. 3-2 is a perspective view of an embodiment of a vapor chamber 324 with vertical structures 328-1, 328-2 that are non-perpendicular to a plane 329 of the main body 326 but extend at least partially perpendicular to the plane 329 of the main body 326. A first vertical structure 328-1 includes a curved portion 331 where a base of the first vertical structure 328-1 is wider than a top of the first vertical structure 328-1. The second vertical structure 328-2 has planar and parallel sides, and the second vertical structure 328-2 extends at a 45° angle to the plane 329 of the main body 326.

In some embodiments, the main body 326 varies in thickness across the plane 329 of the main body 326. In some embodiments, a thickness 333 of the main body 326 changes between a first edge of the main body 326 and a second edge of the main body 326. In at least one embodiment, the thickness 333 of the main body 326 decreases from a bottom edge 335 to a top edge 337 of the main body 326.

In embodiments with a plurality of vertical structures 328, the vertical structures 328 of the vapor chamber 324 define channels 330 therebetween. In the illustrated embodiment of FIG. 3-1, the vertical structures 328 of the vapor chamber 324 are substantially parallel to one another and define channels 330 of constant dimension(s) (e.g., depth and/or width). As will be described herein, the vertical structures 328 have, in some embodiments, other dimensions or orientations that define channels 330 with varying dimensions. In some embodiments, an immersion working fluid flows through the channels 330 to absorb and remove heat from the surface of the vapor chamber 324.

Figure 4:
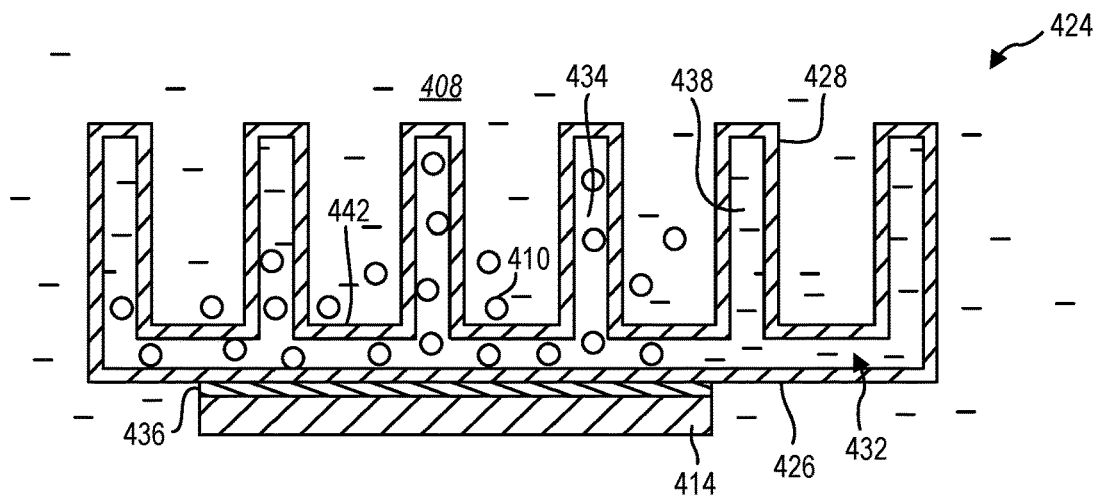
FIG. 4 is a cross-sectional view of a vapor chamber, according to at least one embodiment of the present disclosure.

FIG. 4 is a cross-sectional view of an embodiment of a vapor chamber 424 positioned on a heat-generating component 414. In some embodiments, the heat-generating component 414 is a high-capacity component of a server computer, such as a CPU, a GPU, or other component that requires greater thermal management than other heat-generating components of the server computer. For example, a vapor chamber 424 according to the present disclosure may be applied to a CPU while system memory modules are cooled by the immersion cooling fluid without a vapor chamber heat sink.

In some embodiments, the vapor chamber 424 has an interior volume 432 inside the main body 426 and the vertical structures 428. The vapor chamber 424 has a vapor chamber working fluid 434 positioned therein. In some embodiments, the vapor chamber 424 includes a wicking structure through which the vapor chamber working fluid 434 moves, as will be described in more detail herein. The wicking structure assists in moving the vapor chamber working fluid 434 through the interior volume 432 by capillary effects. A porosity of the wicking structure balances the capillary effect with a permeability of the wicking structure.

The vapor chamber working fluid has a boiling temperature below a critical temperature at which the heat-generating components experience thermal damage. In some embodiments, the boiling temperature of the vapor chamber working fluid is less than a critical temperature of the heat-generating components. In some embodiments, the boiling temperature of the vapor chamber working fluid is less about 90° C. at 1 atmosphere of pressure. In some embodiments, the boiling temperature of the vapor chamber working fluid is less about 80° C. at 1 atmosphere of pressure. In some embodiments, the boiling temperature of the vapor chamber working fluid is less about 70° C. at 1 atmosphere of pressure. In some embodiments, the boiling temperature of the vapor chamber working fluid is less about 60° C. at 1 atmosphere of pressure. In some embodiments, the boiling temperature of the vapor chamber working fluid is at least about 35° C. at 1 atmosphere of pressure.

In some embodiments, the vapor chamber working fluid includes water. In some embodiments, the vapor chamber working fluid includes glycol. In some embodiments, the vapor chamber working fluid includes a combination of water and glycol. In some embodiments, vapor chamber working fluid is an aqueous solution. In some embodiments, the vapor chamber working fluid is a non-conductive fluid. In some embodiments, the vapor chamber working fluid is an electronic liquid, such as FC-72 available from 3M.

The vapor chamber 424 is thermally connected to a heat-generating component 414. In some embodiments, the vapor chamber 424 is coupled directly to the heat-generating component 414. In some embodiments, the vapor chamber 424 is coupled to a thermal interface material (TIM) 436, which is coupled to the heat-generating component 414. In some examples, the TIM 436 is a thermal paste between the main body 426 of the vapor chamber 424 and the heat-generating component 414. When pressed between the main body 426 of the vapor chamber 424 and a surface of the heat-generating component 414, the TIM 436 conforms to the two surfaces providing a continuous thermally conductive connection therebetween.

In some embodiments, the vapor chamber 424 includes, in the interior volume 432, a vapor chamber working fluid 434 with a boiling temperature below a peak operating temperature of the heat-generating component 414. For example, if the heat-generating component 414 has a peak operating temperature of 60° C., the boiling temperature of the vapor chamber working fluid 434 is below 60° C. Upon receiving heat from the heat-generating component 414 (either directly or indirectly through the TIM), the liquid phase 438 of the vapor chamber working fluid rises in temperature and vaporizes into a vapor phase 440 of the vapor chamber working fluid. In some embodiments, the vapor phase 440 of the vapor chamber working fluid expands through a wicking structure of the vapor chamber 424.

In some embodiments, the vapor phase 440 of the vapor chamber working fluid is condensed by rejection of thermal energy to the immersion working fluid outside the vapor chamber 424. In some embodiments, the main body 426 and/or the vertical structures 428 of the vapor chamber 424 are substantially surrounded by a liquid phase 408 of the immersion working fluid, which receives heat from the vapor chamber 424 to cool the vapor chamber working fluid 434 therein.

In some embodiments, movement of the vapor chamber working fluid 434 within the interior volume 432 is driven by or assisted by the boiling and condensing of the vapor chamber working fluid 434. Therefore, efficient transfer of the heat through the walls 442 of the vapor chamber 424 is needed to efficiently circulate the vapor chamber working fluid 434. The thermal transfer from the vapor chamber working fluid 434 to the immersion working fluid is increased by maintaining the largest thermal gradient possible. Some embodiments of vapor chambers according to the present disclosure include internal features and/or external features to increase the thermal transfer from the vapor chamber working fluid to the immersion cooling fluid.

Figure 5:
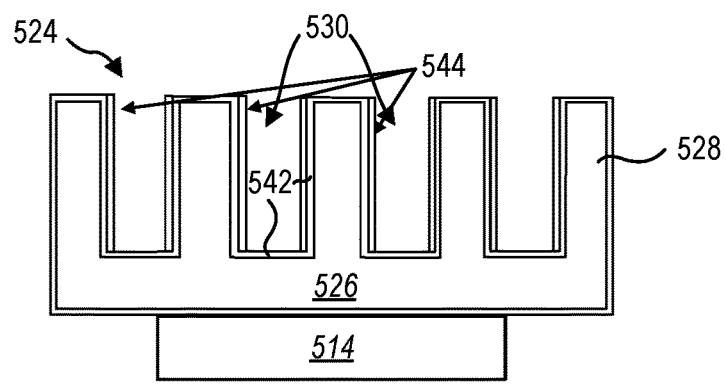
FIG. 5 is a schematic representation of a vapor chamber with an enhanced boiling surface, according to at least one embodiment of the present disclosure.

FIG. 5 is a schematic cross-sectional view of another embodiment of a vapor chamber 524 for immersion cooling. In some embodiments, a vapor chamber 524 includes external features, such as surface features or treatments to enhance boiling of the immersion working fluid in contact with the vapor chamber 524. In some embodiments, the vapor chamber 524 includes an enhanced boiling surface 544 on at least a portion of the outer surface of the vapor chamber 524. In some embodiments, the enhanced boiling surface 544 is on select portions of the vapor chamber 524. In some embodiments, the enhanced boiling surface 544 is on the vertical structure(s) 528. In some embodiments, the enhanced boiling surface 544 is on the main body 526 of the vapor chamber 524. In some embodiments, the enhanced boiling surface 544 is on substantially all of the outer surface of the vapor chamber 524. As used herein, the outer surface of the vapor chamber is the surface with which the immersion working fluid is in contact, as at least a portion of the vapor chamber is the contact area with the TIM or heat-generating component 514. In at least one example, the enhanced boiling surface 544 is on the surface of the main body 526 and vertical structures 528 opposite the heat source or heat-generating component 514. Boiling of the immersion working fluid between the vapor chamber 524 and a motherboard, socket, substrate, or other support of the heat-generating component 514 may create an undesirable expansion force between the main body 526 and the motherboard, socket, substrate, or other support of the heat-generating component 514.

The enhanced boiling surface 544 includes suitable surface features to increase the formation of vapor bubbles on the surface. In some embodiments, the enhanced boiling surface 544 includes grooves, ridges, pockets, recesses, nucleation sites, a porous coating, other boiling enhancing surface textures, or combinations thereof to promote the formation of vapor bubbles in the immersion working fluid and lower the energy required to begin boiling of the immersion working fluid. Lowering the energy to boil the immersion working fluid allows the immersion working fluid to carry away the heat from the vapor chamber 524 more efficiently.

In some embodiments, the vapor bubbles in the immersion working fluid create a fluidic drag on the liquid phase of the immersion working fluid. The fluidic drag flows the liquid phase of the immersion working fluid along the surface of the vapor chamber 524. In some embodiments, inducing a flow of liquid phase of the immersion working fluid across the vapor chamber 524 draws colder immersion working fluid in contact with the vapor chamber 524, increasing the thermal gradient and further increasing the efficiency of thermal transfer from the vapor chamber working fluid to the immersion working fluid.

The enhanced boiling surface 544 of the vertical structures 528, in some embodiments, concentrates the formation of vapor bubbles in the channels 530, further promoting flow of immersion working fluid through the channels 530 and past the vapor chamber 524 to transfer thermal energy from the vapor chamber working fluid to the immersion cooling fluid to condense the vapor phase of the vapor chamber working fluid back into a liquid phase, further promoting the circulation of the vapor chamber working fluid to spread the heat from the heat-generating component 514.

In some embodiments, the enhanced boiling surface 544 is an additive surface treatment, such as a surface treatment that is sintered to the vapor chamber 524. In some embodiments, a powder precursor is sintered to the surface to provide a rough surface with increased surface area and nucleation sites to promote boiling of the immersion working fluid in contact with the enhanced boiling surface 544. In some embodiments, the enhanced boiling surface 544 includes additively manufactured (e.g., 3D-printed) structures thereon. In some embodiments, the enhanced boiling surface 544 is produced with a subtractive surface treatment, such as mechanically, electrically, or chemically etching or scoring the surface of the vapor chamber 524 to provide a rough surface with increased surface area and nucleation sites to promote boiling of the immersion working fluid in contact with the enhanced boiling surface 544. In some embodiments, the enhanced boiling surface 544 is integral to the vapor chamber 524 surface as manufactured, such as during the casting or stamping process of forming the walls 542 of the vapor chamber 524. In at least one example, the enhanced boiling surface 544 includes a plurality of ridges and/or recesses created in the material of the vapor chamber 524 while forming the exterior walls 542 of the vapor chamber 524.

Figure 6:
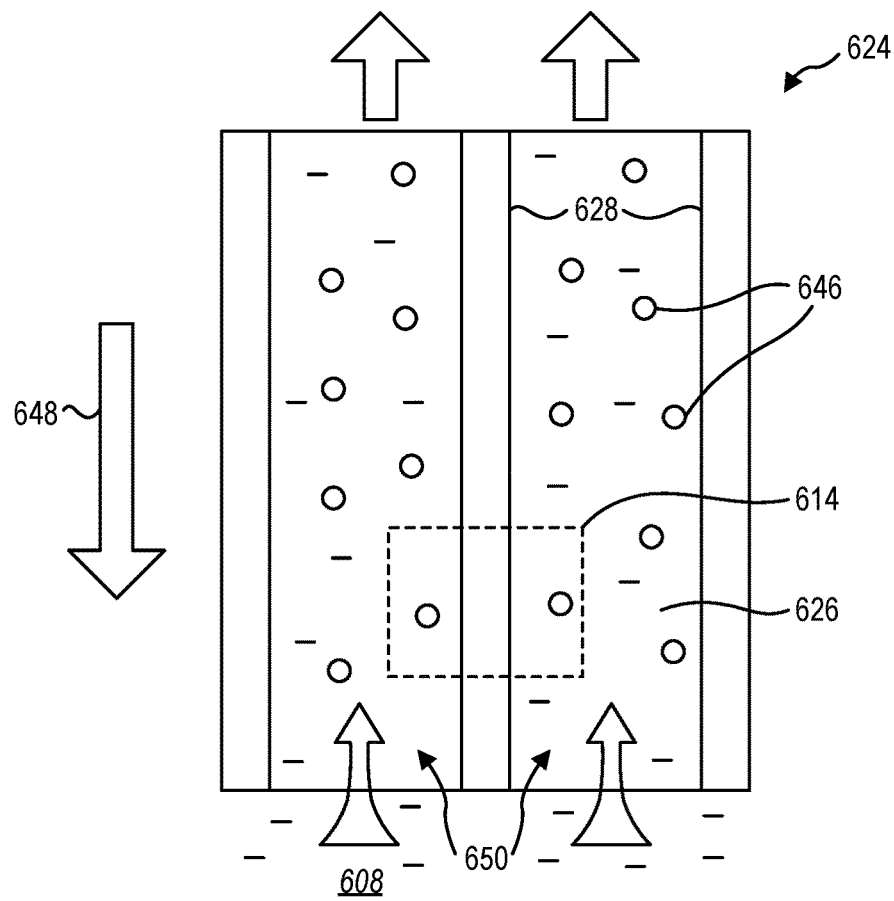
FIG. 6 is a front view of a vapor chamber immersed in immersion working fluid, according to at least one embodiment of the present disclosure.

FIG. 6 is a front view of an embodiment of a vapor chamber 624 immersed in immersion working fluid and oriented with the channels 630 substantially in the direction of gravity 648. In some embodiments, the sidewalls of the channels 630 (e.g., the vertical structures 628) and the main body 626 cause the liquid phase 608 of the immersion working fluid to boil. The vapor bubbles 646 cause a fluidic drag on the liquid phase 608 of the immersion working fluid to draw the liquid phase 608 of the immersion working fluid through the channels 630 and across the surfaces of the vapor chamber 624.

In some embodiments, the heat-generating component 614 is positioned in the lower half of the vapor chamber 624 as positioned when installed in an immersion cooling system. In some embodiments, the heat-generating component 614 is positioned in the lower third of the vapor chamber 624. Positioning the heat-generating component 614 in the lower portion of the vapor chamber 624 when immersed in immersion working fluid may assist in circulating the vapor chamber working fluid and/or the immersion working fluid and improving thermal transfer between the vapor chamber working fluid and the immersion working fluid. In some embodiments, the vapor bubbles of the vapor chamber working fluid rise toward the upper portion of the vapor chamber, and, upon condensing into a liquid phase of the vapor chamber working fluid, the vapor chamber working fluid drips back down toward the heat-generating component 614 under the force of gravity when the channels 630 of the vapor chamber 624 are oriented substantially in the direction of gravity 648.

In some embodiments, positioning the heat-generating component 614 in the lower portion of the vapor chamber 624 increases the thermal gradient proximate to the heat-generating component 614. The fluidic drag of the upwardly moving vapor bubbles 646 of the immersion working fluid, in some embodiments, induces an upward flow of the liquid phase 608 of the immersion working fluid. The liquid phase 608 of the immersion working fluid drawn from below the vapor chamber 624 is cooler than the liquid phase 608 of the immersion working fluid above or laterally adjacent to the vapor chamber 624, causing the channels 630 to fill with a flow of cooled liquid phase 608 of the immersion working fluid, thereby increasing the thermal gradient proximate to the heat-generating component 614.

Figure 7:
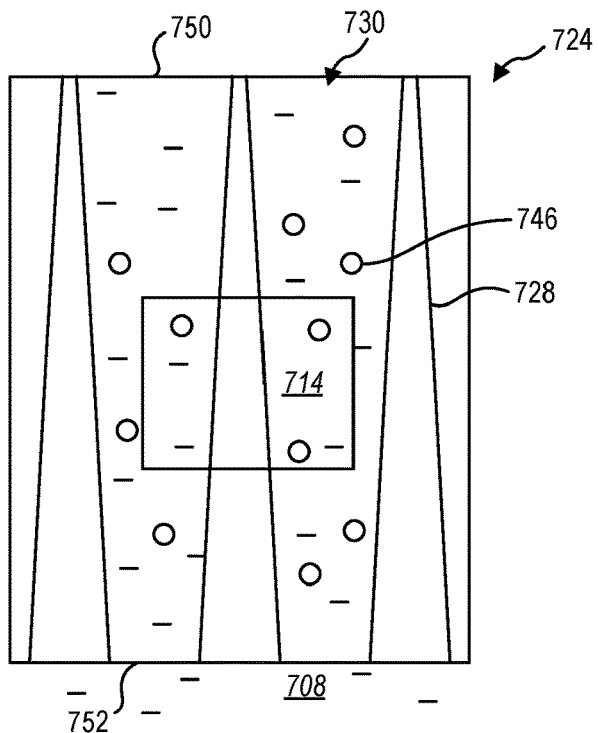
FIG. 7 is a front view of another vapor chamber immersed in immersion working fluid, according to at least one embodiment of the present disclosure.

FIG. 7 illustrates another embodiment of a vapor chamber 724 according to the present disclosure. In some embodiments, the vertical structures 728 vary in at one property or dimension to further drive movement of the immersion working fluid outside of the vapor chamber 724 and/or vapor chamber working fluid inside the vapor chamber 724. In at least one embodiment, the vertical structures 728 of the vapor chamber 724 are fins that taper in the upward direction (e.g., opposite the direction of gravity) to drive flow of the liquid phase 708 of the immersion working fluid. In some embodiments, as the vertical structures 728 taper, the channels 730 defined between the vertical structures 728 consequently widen.

The flow from the vapor bubbles 746 draws the liquid phase 708 of the immersion working fluid upward through the widening channels 730. The formation of vapor bubbles 746 in the liquid phase 708 of the immersion working fluid increases pressure in the immersion working fluid. In some embodiments with channels of constant dimensions, the increased pressure can inhibit flow of the immersion working fluid through the channel. As additional vapor bubbles 746 form on the surface of the vapor chamber 724 due to the immersion working fluid 708 boiling, the flow continues upward through the widening channels 730 despite the expansion of immersion working fluid 708 vaporizing into the vapor bubbles 746. In some embodiments, the channels 730 are at least 10% wider at a top 750 of the channel 730 than a bottom 752 of the channel 730. In some embodiments, the channels 730 are at least 50% wider at a top 750 of the channel 730 than a bottom 752 of the channel 730. In some embodiments, the channels 730 are at least twice as wide at a top 750 of the channel 730 than a bottom 752 of the channel 730.

In some embodiments, the bottom portion of at least one vertical structure 728 is wider than the top portion of the vertical structure 728. In some embodiments, the vertical structure 728, therefore, includes more interior volume and more vapor chamber working fluid in the lower portion of the vapor chamber 724. More vapor chamber working fluid in the lower portion allows more thermal mass of the vapor chamber 724 to be present in proximity to the cooler immersion liquid working fluid 708 drawn in at the bottom 752 of the channels 730.

In some embodiments, a surface of the vertical structures 728 is tuned with an enhanced boiling surface 744 to create boiling fluid turbulence in the liquid phase 708 of the immersion working fluid, thus increasing the fluid boundary layer for enhanced cooling. In addition to the enhanced boiling surface 744, one or more surface features, such as grooves or troughs, may be present on the surface(s) of the vertical structures 728 and/or the enhanced boiling surface 744 to induce or increase a Venturi effect. The Venturi effect on the surface of the vertical structures 728 may increase the buoyant velocity of the liquid phase 708 of the immersion working fluid.

In some of the described embodiments, the upper portion of the vapor chamber 724 has a lower temperature gradient than the lower portion and thermal transfer efficiently may be reduced in the upper portion. In other embodiments, one or more external or internal features of the vapor chamber 724 varies in the vertical direction to maintain or improve the thermal transfer efficiency of the vapor chamber 724.

Figure 8:
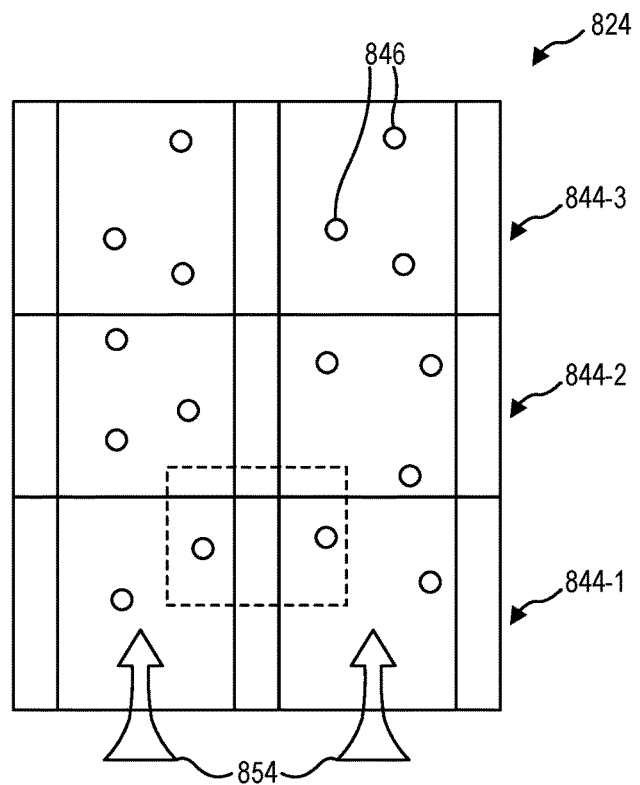
FIG. 8 is a front view of yet another vapor chamber immersed in immersion working fluid, according to at least one embodiment of the present disclosure.

FIG. 8 is a schematic front view of varying surface features to drive more consistent rate of vapor bubble 846 formation across the vapor chamber 824. For example, different types of enhanced boiling surfaces 844 may be positioned in different areas of the exterior of the vapor chamber 824. In some embodiments, a first enhanced boiling surface 844-1 is located proximate the bottom of the vapor chamber 824 with at least a second enhanced boiling surface 844-2 located above the first enhanced boiling surface 844-1 in the direction of immersion working fluid flow 854 (e.g., opposite the direction of gravity). In at least one embodiment, a vapor chamber 824 includes three enhanced boiling surfaces 844-1, 844-2, 844-3 in series in the direction of immersion working fluid flow 854. For example, each successive enhanced boiling surface 844-1, 844-2, 844-3 may include more nucleation sites to promote more efficient vapor bubble 846 formation as the thermal gradient between the immersion working fluid and the vapor chamber working fluid decreases in the direction of immersion working fluid flow 854.

Figure 9:
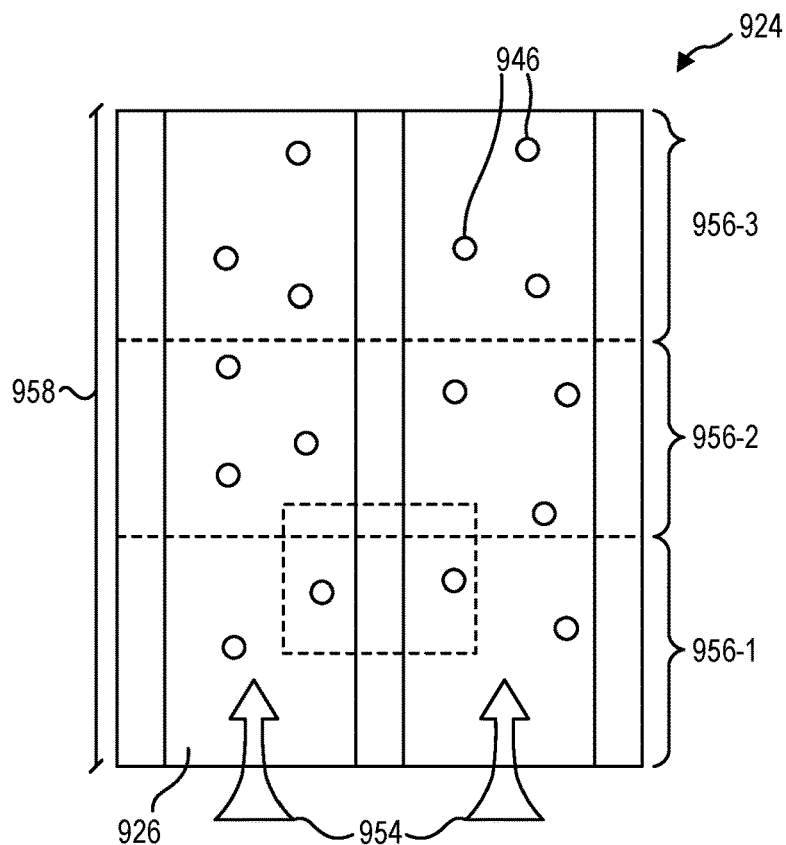
FIG. 9 is a front view of a further vapor chamber immersed in immersion working fluid, according to at least one embodiment of the present disclosure.

In some embodiments, interior features vary relative to the heat-generating component and/or in the direction of immersion working fluid flow. FIG. 9 is a front view of an embodiment of a vapor chamber 924 with a varying porosity to assist vapor chamber working fluid movement and increase thermal gradient to immersion working fluid. In some embodiments, the porosity of the wicking structure in the interior volume of the vapor chamber 924 varies in relation to the heat-generating element 914 and/or the immersion working fluid flow 954 induced by the vapor bubble 946 formation. A small pore size increases capillary pumping action of the vapor chamber working fluid in the wicking structure. A larger pore size allows greater permeability in the wicking structure.

In some embodiments, the porosity increases in the direction of the immersion working fluid flow 954 induced by the vapor bubbles 946. In some embodiments, the porosity increases continuously in the direction of immersion working fluid flow 954. In some embodiments, the porosity changes in discrete regions. For example, a first portion 956-1 of the wicking structure has a substantially constant first porosity, and a second portion 956-2 has a substantially constant porosity. In some embodiments, the first portion 956-1 is at least 10% of the length 958 of the main body 926 of the vapor chamber 924. In some embodiments, the first portion 956-1 is at least 20% of the length 958 of the main body 926 of the vapor chamber 924. In some embodiments, the first portion 956-1 is at least one-third of the length 958 of the main body 926 of the vapor chamber 924.

In some embodiments, the porosity increases with distance from the heat-generating component 914. For example, the porosity increases radially away from the location of the heat-generating component 914 in contact with the vapor chamber 924. In other examples, the porosity increases in discrete steps at certain distances from the location of the heat-generating component 914 in contact with the vapor chamber 924.

Figure 10:
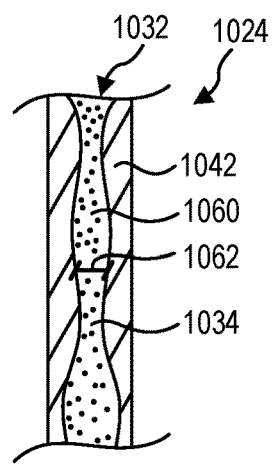
FIG. 10 is a cross-sectional view of a vapor chamber with varying interior volume height, according to at least one embodiment of the present disclosure.

FIG. 10 is a side cross-sectional view of the interior volume 1032 of an embodiment of a portion of a vapor chamber 1024. In some embodiments, the vapor chamber 1024 includes a wicking structure 1060 in the interior volume 1032 of the main body and/or the vertical structures, and the interior volume 1032 is defined by inner surfaces of the vapor chamber walls 1042. A distance between the inner surfaces defines the interior volume height 1062. In some embodiments, the interior volume height 1062 is constant throughout the interior volume 1032 (such as the interior volume 1032 described in relation to FIG. 4) of the main body and/or the vertical structures. In some embodiments, such as illustrated in FIG. 10, one or both inner surfaces opposite one another are non-planar (e.g., include at least one curve). In some embodiments, the non-planar inner surfaces produce a varying interior volume height 1062 of the main body and/or the vertical structures. In at least one example, a first inner surface is non-planar and an opposing second inner surface is planar, and the variations in the interior volume height 1062 are produced by the non-planar shape of the first inner surface. In another example, the first inner surface and second inner surface are mirrored, producing a symmetrical interior volume 1032 of the main body and/or the vertical structures that varies in height 1062. In some embodiments, the non-planar inner surfaces are complementary to one another and produce a constant height despite the position of the interior volume 1032 moving relative to the walls 1042.

In some embodiments, the varying inner surfaces create a periodic cross-sectional area of the interior volume 1032 of the main body and/or the vertical structures. In some embodiments, the periodic cross-sectional area acts as a pumping structure to assist vapor chamber working fluid 1034 movement and increase thermal gradient to immersion working fluid outside of the vapor chamber 1024.

INDUSTRIAL APPLICABILITY

In some embodiments, a high-capacity component of the computing devices or systems in the immersion cooling system requires a large amount of thermal management. The heat generated by the high-capacity component may be transferred to the immersion working fluid by a heat spreader. In some embodiments, the heat spreader includes a vapor chamber including three-dimensional surface features and/or surface treatments to increase heat transfer and/or boiling of the immersion working fluid on a surface of the vapor chamber.

Whether the immersion cooling system is a two-phase cooling system (wherein the immersion working fluid vaporizes and condenses in a cycle) or a one-phase cooling system (wherein the immersion working fluid remains in a single phase in a cycle), the heat transported from the heat-generating components outside of the immersion chamber is further exchanged with an ambient fluid to exhaust the heat from the system.

In some embodiments, a server computer or other computing device is positioned inside an immersion tank for cooling. The immersion tank houses a working fluid that cools the server computer by absorbing heat from the components of the server computer. The liquid working fluid may vaporize into vapor working fluid which rises in the tank toward a condenser. In some embodiments, the high-capacity components of the server computer, such as a CPU, GPU, or other components generate large amounts of heat. In some embodiments, a vapor chamber heat sink transfers heat to the immersion working fluid to boil the liquid working fluid, and the fluidic drag of the vapor bubbles further induces flow of the immersion working fluid across a surface of the vapor chamber.

Immersion working fluid is recycled through the immersion cooling system and, in some embodiments, the immersion working fluid is a dielectric fluid or other fluid that is expensive. An immersion cooling system that uses less immersion working fluid and/or uses the working fluid more efficiently allows for cost savings in the immersion working fluid. In some embodiments, a vapor chamber heat sink according to the present disclosure allows for cooling of the high-capacity components in a larger cooling volume of the immersion working fluid, more efficiently utilizing the available immersion working fluid. A larger volume of immersion working fluid has a larger thermal mass, allowing more heat to be absorbed by the immersion working fluid.

In some embodiments, the liquid working fluid receives heat in a cooling volume of immersion working fluid immediately surrounding the heat-generating components. The cooling volume is the region of the immersion working fluid (including both liquid and vapor phases) that is immediately surrounding the heat-generating components and is responsible for the convective cooling of the heat-generating components. In some embodiments, the cooling volume is the volume of immersion working fluid within 5 millimeters (mm) of the heat-generating components.

The immersion working fluid has a boiling temperature below a critical temperature at which the heat-generating components experience thermal damage. For example, the heat-generating components may be computing components that experience damage above 100° Celsius (C). In some embodiments, the boiling temperature of the immersion working fluid is less than a critical temperature of the heat-generating components. In some embodiments, the boiling temperature of the immersion working fluid is less about 90° C. at 1 atmosphere of pressure. In some embodiments, the boiling temperature of the immersion working fluid is less about 80° C. at 1 atmosphere of pressure. In some embodiments, the boiling temperature of the immersion working fluid is less about 70° C. at 1 atmosphere of pressure. In some embodiments, the boiling temperature of the immersion working fluid is less about 60° C. at 1 atmosphere of pressure. In some embodiments, the boiling temperature of the immersion working fluid is at least about 35° C. at 1 atmosphere of pressure. In some embodiments, the working fluid includes water.

In some embodiments, the immersion working fluid includes glycol. In some embodiments, the immersion working fluid includes a combination of water and glycol. In some embodiments, the immersion working fluid is an aqueous solution. In some embodiments, the immersion working fluid is an electronic liquid, such as FC-72 available from 3M, or similar non-conductive fluids. In some embodiments, the heat-generating components, supports, or other elements of the immersion cooling system positioned in the immersion working fluid have nucleation sites on a surface thereof that promote the nucleation of vapor bubbles of the immersion working fluid at or below the boiling temperature of the immersion working fluid.

In some embodiments, a vapor chamber has a main body with one or more vertical structures protruding from the main body in a direction transverse to the main body. In some embodiments, the main body has six vertical structures protruding from the main body substantially perpendicular to a plane of the main body. In some embodiments, the vertical structures extend at least partially perpendicular to the plane of the main body. For example, at least one of the vertical structures may protrude at a non-perpendicular angle to the main body or have a curved surface that is non-perpendicular to the main body, but the dimensions of vertical structure include a transverse component such that the vertical structure protrudes in a perpendicular direction. In at least one example, the vertical structure protrudes from the main body at approximately a 45° angle, and the vertical structure projects in the direction of the plane of the main body an equal amount to projecting in the perpendicular direction of the plane of the main body.

In embodiments with a plurality of vertical structures, the vertical structures of the vapor chamber define channels therebetween. In some embodiments, the vertical structures of the vapor chamber are substantially parallel to one another and define channels of constant dimensions. As will be described herein, the vertical structures have, in some embodiments, other dimensions or orientations that define channels with varying dimensions. In some embodiments, an immersion working fluid may flow through the channels to absorb and remove heat from the surface of the vapor chamber.

In some embodiments, the heat-generating component is a high-capacity component of a server computer, such as a CPU, a GPU, or other heat-generating component that requires greater thermal management than other heat-generating components of the server computer. For example, a vapor chamber according to the present disclosure may be applied to a CPU while system memory modules may be cooled by the immersion cooling fluid without a vapor chamber heat sink.

In some embodiments, the vapor chamber has an interior volume inside the main body and the vertical structures. The vapor chamber has a vapor chamber working fluid positioned therein. In some embodiments, the vapor chamber includes a wicking structure through which the vapor chamber working fluid moves. The wicking structure assists in moving the vapor chamber working fluid through the interior volume by capillary effects. A porosity of the wicking structure balances the capillary effect with a permeability of the wicking structure.

The vapor chamber is thermally connected to a heat-generating component. In some embodiments, the vapor chamber is coupled directly to the heat-generating component. In some embodiments, the vapor chamber is coupled to a thermal interface material (TIM), which is coupled to the heat-generating component. In some examples, the TIM is a thermal paste between the main body of the vapor chamber and the heat-generating component. When pressed between the main body of the vapor chamber and a surface of the heat-generating component, the TIM conforms to the two surfaces providing a continuous thermally conductive connection therebetween.

In some embodiments, the vapor chamber includes, in the interior volume, a vapor chamber working fluid with a boiling temperature below a peak operating temperature of the heat-generating component. For example, if the heat-generating component has a peak operating temperature of 60° C., the boiling temperature of the vapor chamber working fluid is below 60° C. Upon receiving heat from the heat-generating component (either directly or indirectly through the TIM), the vapor chamber working fluid rises in temperature and vaporizes into a vapor phase of the vapor chamber working fluid. In some embodiments, the vapor phase of the vapor chamber working fluid may expand through a wicking structure of the vapor chamber.

In some embodiments, the vapor phase of the vapor chamber working fluid is condensed by rejection of thermal energy to the immersion working fluid outside the vapor chamber. In some embodiments, the main body and/or the vertical structures of the vapor chamber are substantially surrounded by a liquid working fluid of the immersion working fluid, which receives heat from the vapor chamber to cool the vapor chamber working fluid therein.

In some embodiments, movement of the vapor chamber working fluid within the interior volume is driven by or assisted by the boiling and condensing of the vapor chamber working fluid. Therefore, efficient transfer of the heat through the walls of the vapor chamber is needed to efficiently circulate the vapor chamber working fluid. The thermal transfer from the vapor chamber working fluid to the immersion working fluid is increased by maintaining the largest thermal gradient possible. Some embodiments of vapor chambers according to the present disclosure include internal features and/or external features to increase the thermal transfer from the vapor chamber working fluid to the immersion cooling fluid.

In some embodiments, a vapor chamber includes external features, such as surface features or treatments to enhance boiling of the immersion working fluid in contact with the vapor chamber. In some embodiments, the vapor chamber includes an enhanced boiling surface on at least a portion of the outer surface of the vapor chamber. In some embodiments, the enhanced boiling surface is positioned on the vertical structure(s). In some embodiments, the enhanced boiling surface is positioned on the main body of the vapor chamber. In some embodiments, the enhanced boiling surface is positioned on substantially all of the outer surface of the vapor chamber with which the immersion working fluid is in contact. In some embodiments, the enhanced boiling surface is positioned on select portions of the vapor chamber. In at least one example, the enhanced boiling surface is positioned on the surface of the main body and vertical structures opposite the heat source or heat-generating component. Boiling of the immersion working fluid between the vapor chamber and a motherboard, socket, substrate, or other support of the heat-generating component may create an undesirable expansion force between the main body and the motherboard, socket, substrate, or other support of the heat-generating component.

In some embodiments, the enhanced boiling surface includes grooves, ridges, pockets, recesses, nucleation sites, a porous coating, other boiling enhancing surface textures, or combinations thereof to promote the formation of vapor bubbles in the immersion working fluid and lower the energy required to begin boiling of the immersion working fluid. Lowering the energy to boil the immersion working fluid allows the immersion working fluid to carry away the heat from the vapor chamber more efficiently.

In some embodiments, the vapor bubbles in the immersion working fluid create a fluidic drag on the liquid phase of the immersion working fluid. The fluidic drag flows the liquid phase of the immersion working fluid along the surface of the vapor chamber. In some embodiments, inducing a flow of the liquid phase of the immersion working fluid across the vapor chamber draws colder immersion working fluid in contact with the vapor chamber, increasing the thermal gradient and further increasing the efficiency of thermal transfer from the vapor chamber working fluid to the liquid phase of the immersion working fluid.

The enhanced boiling surface of the vertical structures, in some embodiments, concentrates the formation of vapor bubbles in the channels, further promoting flow of immersion working fluid through the channels and past the vapor chamber to transfer thermal energy from the vapor chamber working fluid to the immersion working fluid to condense the vapor phase of the vapor chamber working fluid back into a liquid phase, further promoting the circulation of the vapor chamber working fluid to spread the heat from the heat-generating component.

In some embodiments, the enhanced boiling surface is an additive surface treatment, such as a surface treatment that is sintered to the vapor chamber. In some embodiments, a powder precursor is sintered to the surface to provide a rough surface with increased surface area and nucleation sites to promote boiling of the immersion working fluid in contact with the enhanced boiling surface. In some embodiments, the enhanced boiling surface includes additively manufactured (e.g., 3D-printed) structures thereon. In some embodiments, the enhanced boiling surface is a subtractive surface treatment, such as mechanically, electrically, or chemically etching or scoring the surface of the vapor chamber to provide a rough surface with increased surface area and nucleation sites to promote boiling of the immersion working fluid in contact with the enhanced boiling surface. In some embodiments, the enhanced boiling surface is integral to the vapor chamber surface as manufactured, such as during the casting or stamping process of forming the walls of the vapor chamber. In at least one example, the enhanced boiling surface includes a plurality of ridges and/or recesses created in the material of the vapor chamber while forming the exterior walls of the vapor chamber.

In some embodiments, the sidewalls of the channels and the main body cause the immersion working fluid to boil. The vapor bubbles cause a fluidic drag on the liquid phase of the immersion working fluid to draw the immersion working fluid through the channels and across the surfaces of the vapor chamber.

In some embodiments, the heat-generating component is positioned in the lower half of the vapor chamber. In some embodiments, the heat-generating component is positioned in the lower third of the vapor chamber. Positioning the heat-generating component in the lower portion of the vapor chamber may assist in circulating the vapor chamber working fluid and improving thermal transfer between the vapor chamber working fluid and the immersion working fluid. In some embodiments, the vapor bubbles of the vapor chamber working fluid rise toward the upper portion of the vapor chamber, and, upon condensing into a liquid phase of the vapor chamber working fluid, the vapor chamber working fluid drips back down toward the heat-generating component under the force of gravity when the vapor chamber is oriented substantially vertically.

In some embodiments, positioning the heat-generating component in the lower portion of the vapor chamber increases the thermal gradient proximate the heat-generating component. The fluidic drag of the upwardly moving vapor bubbles of the immersion working fluid, in some embodiments, induces an upward flow of the liquid phase of the immersion working fluid. The liquid phase of the immersion working fluid drawn from below the vapor chamber is cooler than the liquid phase of the immersion working fluid above or laterally adjacent to the vapor chamber, causing the channels to fill with a flow of the cooled liquid phase of the immersion working fluid, increasing the thermal gradient proximate the heat-generating component.

In some embodiments, the vertical structures vary in at one property or dimension to further drive movement of the immersion working fluid outside of the vapor chamber and/or vapor chamber working fluid inside the vapor chamber. In at least one embodiment, the vertical structures of the vapor chamber are fins that taper in the upward direction to drive flow of the liquid phase of the immersion working fluid. In some embodiments, as the vertical structures taper, the channels defined between the vertical structures consequently widen.

The flow from the vapor bubbles draws immersion working fluid upward through the widening channels. As additional vapor bubbles form on the surface of the vapor chamber due to the liquid phase of the immersion working fluid boiling, the flow continues upward despite the expansion of the liquid phase of the immersion working fluid vaporizing into the vapor bubbles. In some embodiments, the channels are at least 10% wider at a top of the channel than a bottom of the channel. In some embodiments, the channels are at least 50% wider at a top of the channel than a bottom of the channel. In some embodiments, the channels are at least twice as wide at a top of the channel than a bottom of the channel.

In some embodiments, a surface of the vertical structures is tuned with an enhanced boiling surface to create boiling fluid turbulence, thus increasing the fluid boundary layer for enhanced cooling. In addition to changing the surface treatment, one or more surface features, such as grooves for troughs, may be designed onto the surface of the vertical structures and/or the enhanced boiling surface to induce or increase a Venturi effect. The Venturi effect on the surface of the vertical structures may increase the buoyant velocity of the fluid.

In some embodiments, the bottom portion of at least one vertical structure is wider than the top portion of the vertical structure. In some embodiments, the vertical structure, therefore, includes more interior volume and more vapor chamber working fluid in the lower portion of the vapor chamber. More vapor chamber working fluid in the lower portion allows more thermal mass of the vapor chamber to be present in proximity to the cooler liquid phase of the immersion working fluid drawn in at the bottom of the channels.

In some of the described embodiments, the upper portion of the vapor chamber may have a lower temperature gradient than the lower portion and thermal transfer efficiently may be reduced. In other embodiments, one or more external or internal features of the vapor chamber may vary in the vertical direction to maintain or improve the efficiency of the vapor chamber.

In some examples, different types of enhanced boiling surfaces may be positioned in different areas of the exterior of the vapor chamber. In some embodiments, a first enhanced boiling surface is located proximate the bottom of the vapor chamber with at least a second enhanced boiling surface located above the first enhanced boiling surface in the direction of immersion working fluid flow. In at least one embodiment, a vapor chamber includes three enhanced boiling surfaces in series in the direction of immersion working fluid flow. For example, each successive enhanced boiling surface may include more nucleation sites to promote more efficient vapor bubble formation as the thermal gradient between the immersion working fluid and the vapor chamber working fluid decreases in the direction of immersion working fluid flow.

In some embodiments, interior features vary relative to the heat-generating component and/or in the direction of immersion working fluid flow. In some embodiments, a vapor chamber with a varying porosity assists vapor chamber working fluid movement and increases thermal gradient to immersion working fluid. In some embodiments, the porosity of the wicking structure in the interior volume of the vapor chamber varies in relation to the heat-generating element and/or the immersion fluid flow direction. A small pore size increases capillary pumping action of the vapor chamber working fluid in the wicking structure. A larger pore size allows greater permeability in the wicking structure.

In some embodiments, the porosity increases in the direction of the immersion working fluid flow. In some embodiments, the porosity increases continuously in the direction of immersion fluid flow. In some embodiments, the porosity changes in discrete regions. For example, a first portion of the wicking structure has a substantially constant first porosity, and a second portion has a substantially constant porosity. In some embodiments, the first portion is at least 10% of the length of the main body of the vapor chamber. In some embodiments, the first portion is at least 20% of the length of the main body of the vapor chamber. In some embodiments, the first portion is at least one-third of the length of the main body of the vapor chamber.

In some embodiments, the porosity increases with distance from the heat-generating component. For example, the porosity increases radially away from the location of the heat-generating component in contact with the vapor chamber. In other examples, the porosity increases in discrete steps at certain distances from the location of the heat-generating component in contact with the vapor chamber.

In some embodiments, the vapor chamber includes a wicking structure in the interior volume, and the interior volume is defined by inner surfaces of the vapor chamber walls. A distance between the inner surfaces defines the interior volume height. In some embodiments, the interior volume height is constant throughout the interior volume. In some embodiments, one or both inner surfaces opposite one another are non-planar (e.g., include at least one curve). In some embodiments, the non-planar inner surfaces produce a varying interior volume height. In at least one example, a first inner surface is non-planar and an opposing second inner surface is planar, and the variations in the interior volume height are produced by the non-planar shape of the first inner surface. In at least another example, the first inner surface and second inner surface are mirrored, producing a symmetrical interior volume that varies in height. In some embodiments, the non-planar inner surfaces are complementary to one another and produce a constant height despite the position of the interior volume moving.

In some embodiments, the varying inner walls create a periodic cross-sectional area of the interior volume. In some embodiments, the periodic cross-sectional area acts as a pumping structure to assist vapor chamber working fluid movement and increase thermal gradient to immersion working fluid.

The present disclosure relates to systems and methods for cooling heat-generating components of a computer or computing device according to at least the examples provided in the sections below:

[A1] In some embodiments, a vapor chamber includes a main body, a first vertical structure, and an enhanced boiling surface. The main body has a first surface and defines a first portion of an interior volume. The first vertical structure protrudes transverse to the main body and defines a second portion of the interior volume. The enhanced boiling surface is on at least a portion of the first vertical structure.

[A2] In some embodiments, the enhanced boiling surface of [A1] is additionally on at least a portion of the main body.

[A3] In some embodiments, the enhanced boiling surface of [A1] or [A2] varies along at least a portion of a length of the vapor chamber.

[A4] In some embodiments, the enhanced boiling surface of any of [A1] through [A3] is an additive surface treatment.

[A5] In some embodiments, the enhanced boiling surface of any of [A1] through [A3] is a subtractive surface treatment.

[A6] In some embodiments, the vapor chamber of any of [A1] through [A5] includes a wicking structure in the interior volume.

[A7] In some embodiments, the first vertical structure of any of [A1] through [A6] has a width that varies along at least a portion of a length of the vapor chamber.

[A8] In some embodiments, an interior volume height of any of [A1] through [A7] varies along at least a portion of a length of the first vertical structure.

[A9] In some embodiments, the vapor chamber of any of [A1] through [A8] includes a vapor chamber working fluid in the interior volume.

[B1] In some embodiments, a vapor chamber includes a main body and a first vertical structure. The main body has a first surface and defining a first portion of an interior volume. The first vertical structure protrudes transverse to the main body and defines a second portion of the interior volume. The first vertical structure has a first end having first width and a second end having a second width that is less than the first width.

[B2] In some embodiments, the vapor chamber of [B1] includes a second vertical structure, and the first vertical structure and the second vertical structure define a channel therebetween.

[B3] In some embodiments, the channel of [B2] varies in width along at least a portion of a length of the first vertical structure.

[B4] In some embodiments, the vapor chamber of any of [B1] through [B3] includes an enhanced boiling surface on at least a portion of the first vertical structure.

[B5] In some embodiments, the vapor chamber of any of [B1] through [B4] includes a wicking structure in the interior volume.

[B6] In some embodiments, an interior volume height of the interior volume of any of [B1] through [B5] varies along at least a portion of a length of the vapor chamber.

[C1] In some embodiments, a vapor chamber includes a main body, a first vertical structure, and a wicking structure. The main body has a first surface and defining a first portion of an interior volume. The first vertical structure protrudes transverse to the main body and defines a second portion of the interior volume. The wicking structure is in the interior volume.

[C2] In some embodiments, a porosity of the wicking structure of [C1] varies along at least a portion of a length of the vapor chamber.

[C3] In some embodiments, the first vertical structure of [C1] or [C2] has a length and an external wall thickness that varies along the length.

[C4] In some embodiments, the vapor chamber of any of [C1] through [C3] includes an enhanced boiling surface on at least a portion of the first vertical structure.

[C5] In some embodiments, the first vertical structure of any of [C1] through [C4] has a width that varies along at least a portion of a length of the vapor chamber.

[D1] In some embodiments, a thermal management system includes a heat-generating component, a vapor chamber, and an immersion working fluid. The vapor chamber is thermally connected to the heat-generating component to conduct thermal energy from the heat-generating component. The vapor chamber includes a main body, at least one vertical structure, and an enhanced boiling surface. The main body is substantially parallel to the heat-generating component, and the vapor chamber defines an interior volume containing a vapor chamber working fluid. The at least one vertical structure of the vapor chamber containing at least a portion of the interior volume and vapor chamber working fluid, and the vertical structure protruding transverse to the main body. The enhanced boiling surface located on at least a portion of the vertical structure. The immersion working fluid contacts at least a portion of the vapor chamber.

[D2] In some embodiments, the immersion working fluid of [D1] has a boiling temperature less than a peak operating temperature of the heat-generating component.

[D3] In some embodiments, a majority of a contact area of the heat-generating component of [D1] or [D2] is thermally connected to the vapor chamber in a bottom half of the vapor chamber in relation to a direction of flow of the immersion working fluid across a surface of the vapor chamber.

[D4] In some embodiments, the vapor chamber of any of [D1] through [D3] includes a thermal interface material between the heat-generating component and the vapor chamber.

[E1] In some embodiments, a thermal management system includes a heat-generating component, a vapor chamber, and an immersion working fluid. The vapor chamber is thermally connected to the heat-generating component to conduct thermal energy from the heat-generating component. The vapor chamber includes an interior volume, a main body, a plurality of vertical structures, and an enhanced boiling surface. The interior volume contains a vapor chamber working fluid. The main body contains at least a portion of the interior volume and vapor chamber working fluid, and a plane of the main body is oriented in a direction of gravity and substantially parallel to the heat-generating component. The plurality of vertical structures contains at least a portion of the interior volume and vapor chamber working fluid, and the vertical structures protrude transverse to the main body and define at least one channel. The enhanced boiling surface located on at least a portion of the vertical structures and main body in the channel. The immersion working fluid contacts at least a portion of the vapor chamber.

[E2] In some embodiments, a width of the channel of [E1] varies along a length of the channel.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about", "substantially", or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the spirit and scope of the present disclosure, and that various changes, substitutions, and alterations may be made to embodiments disclosed herein without departing from the spirit and scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its spirit or characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A vapor chamber comprising:
   a main body having a first surface and defining a first portion of an interior volume;
   a first vertical structure protruding transverse to the main body and defining a second portion of the interior volume, the first vertical structure having a heat transfer surface for transferring heat to an environment of the vapor chamber, wherein the heat transfer surface is an enhanced boiling surface comprising an enhanced boiling surface texture having an increased number of nucleation sites to promote formation of vapor bubbles at the heat transfer surface of the first vertical structure, wherein the enhanced boiling surface is a first enhanced boiling surface covering a first portion of the heat transfer surface, and wherein a second enhanced boiling surface that is different from the first enhanced boiling surface covers a second portion of the heat transfer surface.

2. The vapor chamber of claim 1, wherein the enhanced boiling surface is a surface coating having the enhanced boiling surface texture.

3. The vapor chamber of claim 1, wherein the first vertical structure is a vertical structure of a plurality of vertical structures of the vapor chamber extending transverse to the main body and forming a plurality of channels, wherein each of the plurality of channels includes the heat transfer surface, and wherein the vapor chamber includes the enhanced boiling surface comprising the enhanced boiling surface texture on only the heat transfer surface in the plurality of channels to concentrate the formation of vapor bubbles in the plurality of channels and promote flow of immersion fluid through the plurality of channels.

4. The vapor chamber of claim 1, wherein the second enhanced boiling surface includes more nucleation sites for promoting vapor bubble formation than the first enhanced boiling surface.

5. The vapor chamber of claim 1, wherein the first enhanced boiling surface is positioned proximate a bottom of the vapor chamber in a direction of immersion working fluid flow, and the second enhanced boiling surface is positioned above the first enhanced boiling surface in the direction of immersion working fluid flow.

6. The vapor chamber of claim 1, wherein a third enhanced boiling surface that is different from the first enhanced boiling surface and the second enhanced boiling surface covers a third portion of the heat transfer surface.

7. The vapor chamber of claim 6, wherein the first enhanced boiling surface, the second enhanced boiling surface, and the third enhanced boiling surface are positioned in series in a direction of immersion working fluid flow.

8. The vapor chamber of claim 6, wherein the third enhanced boiling surface includes more nucleation sites for promoting vapor bubble formation than the first enhanced boiling surface and the second enhanced boiling surface.

9. A vapor chamber comprising:
a main body having a major surface and defining a first portion of an interior volume; and
a first vertical structure protruding transverse to the main body from the major surface and defining a second portion of the interior volume, the first vertical structure having a longitudinal axis, the first vertical structure having a first end on the longitudinal axis that is positioned at the major surface and a second end on the longitudinal axis that is positioned at the major surface, wherein a first width of the first end of the first vertical structure is greater than a second width of the second end of the first vertical structure.

10. The vapor chamber of claim 9, further comprising a second vertical structure, wherein the first vertical structure and the second vertical structure define a channel therebetween.

11. The vapor chamber of claim 10, wherein the channel varies in width along at least a portion of a length of the first vertical structure.

12. The vapor chamber of claim 9, further comprising an enhanced boiling surface on at least a portion of the first vertical structure.

13. The vapor chamber of claim 9, further comprising a wicking structure in the interior volume.

14. The vapor chamber of claim 9, wherein an interior volume height varies along at least a portion of a length of the vapor chamber.

15. A vapor chamber comprising:
a main body having a first surface and defining a first portion of an interior volume;
a first vertical structure protruding transverse to the main body and defining a second portion of the interior volume, the first vertical structure having a longitudinal dimension, wherein an external wall thickness of an external wall of the first vertical structure varies along the longitudinal dimension; and
a wicking structure in the interior volume.

16. The vapor chamber of claim 15, wherein a porosity of the wicking structure varies along at least a portion of a length of the vapor chamber.

17. The vapor chamber of claim 16, wherein the porosity of the wicking structure increases away from the main body.

18. The vapor chamber of claim 15, wherein an interior surface of the external wall is non-planar.

19. The vapor chamber of claim 15, further comprising an enhanced boiling surface on at least a portion of the first vertical structure.

20. The vapor chamber of claim 15, wherein the second portion of the interior volume has a periodic cross-section.

* * * * *